US012708004B2

(12) United States Patent
Michael et al.

(10) Patent No.: US 12,708,004 B2
(45) Date of Patent: Aug. 11, 2026

(54) LEADED PACKAGE USING ROUTING LAYER FOR INTEGRATED CIRCUIT DIE

(71) Applicant: Infineon Technologies Canada Inc., Ottawa (CA)

(72) Inventors: Mihalis Michael, San Jose, CA (US); Farzin Najafi, Ottawa (CA); Mohammad Shafayet Zamil, Nepean (CA); Abhinandan Hemant Dixit, Kanata (CA)

(73) Assignee: Infineon Technologies Canada Inc., Ottawa (CA)

( * ) Notice: Subject to any disclaimer, the term of this patent is extended or adjusted under 35 U.S.C. 154(b) by 338 days.

(21) Appl. No.: 18/496,549

(22) Filed: Oct. 27, 2023

(65) Prior Publication Data

US 2025/0140665 A1 May 1, 2025

(51) Int. Cl.
*H10W 70/65* (2026.01)
*H10W 70/685* (2026.01)
(Continued)

(52) U.S. Cl.
CPC ......... *H10W 70/65* (2026.01); *H10W 70/685* (2026.01); *H10W 90/00* (2026.01); *H10W 90/794* (2026.01); *H10W 74/00* (2026.01)

(58) Field of Classification Search
CPC . H10W 20/484; H10W 70/40; H10W 70/411; H10W 70/413; H10W 70/421; H10W 70/464; H10W 70/481; H10W 70/60; H10W 70/65; H10W 70/6523; H10W 70/6525; H10W 70/6528; H10W 70/654; H10W 70/655; H10W 70/656; H10W 70/6565; H10W 70/657; H10W 70/658; H10W 70/685; H10W 70/686; H10W 70/687; H10W 72/00; H10W 72/30; H10W 74/00; H10W 74/111; H10W 90/701; H10W 90/724; H10W 90/726; H10W 90/794; H10W 90/811
See application file for complete search history.

(56) References Cited

U.S. PATENT DOCUMENTS

| | | | |
|---|---|---|---|
| 9,324,819 | B1 | 4/2016 | Lin et al. |
| 2012/0126406 | A1 | 5/2012 | Dix |

(Continued)

OTHER PUBLICATIONS

Extended European Search Report Received for Application No. / Patent No. 24208753.4-1211, Mar. 25, 2025, 11 Pages.

*Primary Examiner* — Cheung Lee
(74) *Attorney, Agent, or Firm* — WORKMAN NYDEGGER

(57) ABSTRACT

A package for an integrated circuit die (e.g., a chip). A routing layer is layered between the chip and package contacts of the package. The chip has a planar surface along which the chip includes die contacts. The routing layer lies along the planar surface of the chip, and electrically connects the die contacts of the chip to the package contacts of the package. This allows the chip, the routing layer, and the package contacts to be stacked together to form a relatively thin, compact package. The routing layer connects the die contacts of the chip to the package contacts of the package, such that the die contacts need not have the same layout as the package contacts, thus allowing packages with the same package contact layouts to be used to package chips with varying die contact layouts. A lead in conductive contact with the package contact.

18 Claims, 5 Drawing Sheets

(51) Int. Cl.

| | |
|---|---|
| ***H10W 90/00*** | (2026.01) |
| *H10W 74/00* | (2026.01) |

(56) References Cited

U.S. PATENT DOCUMENTS

| | | | |
|---|---|---|---|
| 2016/0049315 | A1 | 2/2016 | Uno et al. |
| 2016/0240471 | A1 | 8/2016 | Klowak et al. |
| 2022/0238421 | A1 | 7/2022 | Quinones et al. |

LEADED PACKAGE USING ROUTING LAYER FOR INTEGRATED CIRCUIT DIE

BACKGROUND

An integrated circuit is an electronic circuit that has all of its components manufactured on a common semiconductor substrate by employing semiconductor processing steps. One or more integrated circuits may be incorporated into a package that includes various terminals (e.g., bond pads, pins, or leads). These terminals may be used to, for example, control the integrated circuit, provide power to the integrated circuit, or to allow the integrated circuit to communicate with external components. Packages may provide the integrated circuits with additional physical protection, proper heat dissipation, and mechanical compatibility with external components such as a printed circuit board.

The subject matter claimed herein is not limited to embodiments that solve any disadvantages or that operate only in environments such as those described above. Rather, this background is only provided to illustrate one example technology area where some embodiments described herein may be practiced.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Embodiments described herein relate to a leaded package in which an integrated circuit die (e.g., a chip) is packaged. A routing layer is layered between the integrated circuit die and one or more package contacts of the package. Specifically, the integrated circuit die has a planar surface (e.g., a flat top surface), along which the integrated circuit die includes die contacts. The routing layer lies along the planar surface of the integrated circuit die, and electrically connects the conductive contacts of the integrated circuit die to the package contacts of the package. The package contacts are also relatively flat, and lie along a flat top surface of the routing layer. Accordingly, the conductive contacts of the integrated circuit die, the routing layer, and the package contacts, are each elongated substantially parallel to the planar surface of the integrated circuit die. This allows the integrated circuit die, routing layer, and package contacts to be stacked together to form a relatively thin, compact package.

The package uses the routing layer to connect the die contacts of the integrated circuit die to the package contacts of the package, such that the die contacts of the integrated circuit die need not have the same layout as the package contacts of the package. Thus, packages having the same package contact layout may be used to package various types of integrated circuit dies having different die contact layouts, while still allowing leads of a lead frame to make appropriate contact with the package contact. This is because the routing layer will be customized to perform the correct routing as appropriate given a position of the leads and regardless of the layout of the die contacts of the integrated circuit dies. Furthermore, because the die contacts of the integrated circuit die and the package contacts of the package are in close proximity to each other, connected by conductive portions of the relatively thin routing layer, the overall package may be more compact, and may operate with high power density, low on-resistance, and low parasitic inductance.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the advantages and features of the circuits, systems, and methods described herein can be obtained, a more particular description of the embodiments briefly described herein will be rendered by reference to specific embodiments thereof which are illustrated in the appended drawings. Understanding that these drawings depict only typical embodiments of the circuits, systems and methods described herein, and are not therefore to be considered to be limiting of their scope, certain circuits, systems and methods will be described and explained with additional specificity and detail through the use of the accompanying drawings in which.

DETAILED DESCRIPTION

Embodiments described herein relate to a leaded package in which an integrated circuit die (e.g., a chip) is packaged. A routing layer is layered between the integrated circuit die and one or more package contacts of the package. Specifically, the integrated circuit die has a planar surface (e.g., a flat top surface), along which the integrated circuit die includes die contacts. The routing layer lies along the planar surface of the integrated circuit die, and electrically connects the die contacts of the integrated circuit die to the package contacts of the package. The package contacts are also relatively flat, and lie along a flat top surface of the routing layer. Accordingly, the die contacts of the integrated circuit die, the routing layer, and the package contacts, are each elongated substantially parallel to the planar surface of the integrated circuit die. This allows the integrated circuit die, routing layer, and package contacts to be stacked together to form a relatively thin, compact package.

The package uses the routing layer to connect the die contacts of the integrated circuit die to the package contacts of the package, such that the die contacts of the integrated circuit die need not have the same layout as the package contacts of the package. Thus, packages having the same package contact layout may be used to package various types of integrated circuit dies having different die contact layouts, while still allowing leads of a lead frame to make appropriate contact with the package contact. This is because the routing layer will be customized to perform the correct routing as appropriate given a position of the leads and regardless of the layout of the die contacts of the integrated circuit dies. Furthermore, because the die contacts of the integrated circuit die and the package contacts of the package are in close proximity to each other, connected by conductive portions of the relatively thin routing layer, the overall package may be more compact, and may operate with high power density, low on-resistance, and low parasitic inductance.

Figure 1:
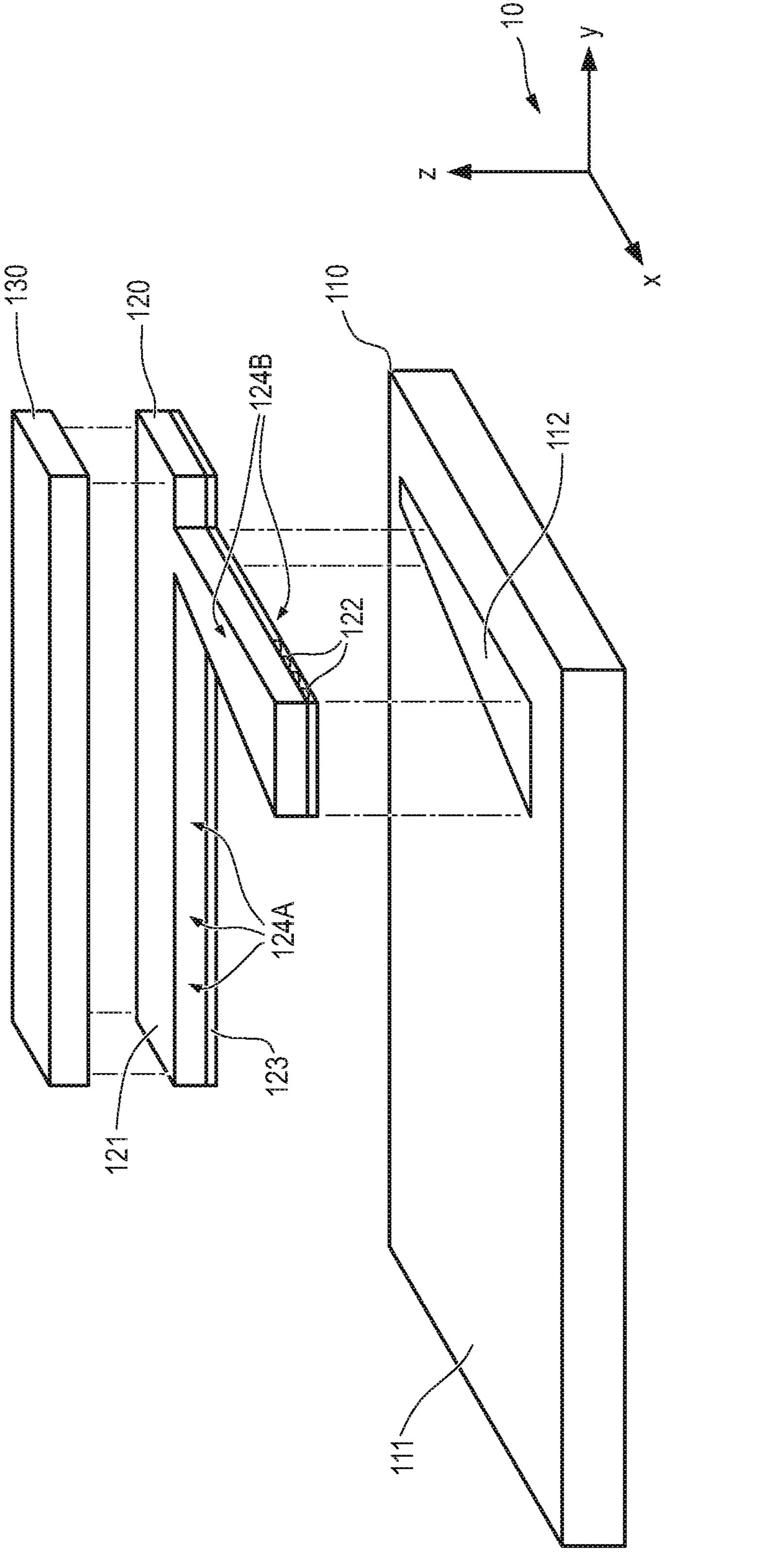
FIG. 1 illustrates a telescopic view of a circuit structure that may be contained within a package in accordance with the principles described herein.

FIG. 1 illustrates a telescopic view of a circuit structure 100 that may be contained within a package in accordance with the principles described herein. FIG. 1 illustrates a coordinate system 101. For convenience and clarity of explanation only, the z-axis of the coordinate system 101 is referred to as vertical, whereas the x-axis and y-axis are referred to as horizontal. Thus, the plane defined by the x-axis and y-axis is horizontal and is referred to herein as the x-y plane. Directions represented by the arrowhead in the x-axis, y-axis and z-axis will be referred to as the positive x-direction, positive y-direction, and positive z-direction, respectively. On the other hand, the direction opposite the positive x-direction, positive y-direction, and positive z-direction will be referred to as the negative x-direction, negative y-direction, and negative z-direction, respectively. That said, this nomenclature is merely for purposes of clarity. The principles described herein are of course not limited to how an actual circuit structure or package is oriented in the real world.

The circuit structure 100 includes an integrated circuit die 110, a routing layer 120, and a package contact 130 (referred to collectively as "the components") stacked on each other in the positive z-direction. That is, the routing layer 120 is stacked on top of the integrated circuit die 110, and the package contact 130 is stacked on top of the routing layer 120. Although, the circuit structure 100 is illustrated as including a single integrated circuit die 110, the principles described herein also apply for packages that contain multiple integrated circuit die 110. Furthermore, for clarity, the circuit structure 100 is shown in telescopic view using vertical dashed lines to represent approximately where the components make contact with each other. The telescopic view is presented as it allows for easier distinction between the components, and better representation of the horizontal alignment of the components.

The integrated circuit die 110 includes a planar surface 111 that extends parallel to the x-y plane. The integrated circuit die 110 also includes a die contact 112 that also extends parallel to the planar surface 111 of the integrated circuit die 110. This die contact 112 is exposed at the planar surface 111 so that the routing layer 120 may make contact with the die contact 112. As an example, the die contact 112 may have a top surface that is co-planar with the planar surface 111 of the integrated circuit die 110. As another non-limiting alternative, the die contact 112 may be layered on top of the planar surface 111 of the integrated circuit die 110.

Although the integrated circuit die 110 is illustrated as including a single die contact 112, the principles described herein may also be used to connect multiple die contacts to appropriate package contacts. Additionally, although the circuit structure 100 is illustrated as including a single package contact 130, the principles described herein may also be used to connect multiple package contacts to appropriate die contacts. Nevertheless, to keep the example simple for now, the circuit structure 100 is illustrated as connecting a single die contact 112 to a single package contact 130.

The die contact 112 may, for example, make electrical contact with an integrated circuit contained within the integrated circuit die 110. As a specific example, suppose that the integrated circuit die 110 contains a field-effect transistor (e.g., a gallium nitride transistor). In that case, the die contact 112 may be a gate contact electrically connected to a gate terminal, a drain contact electrically connected to a drain terminal, or a source contact electrically connected to a source terminal of the field-effect transistor. In fact, if the integrated circuit was a field-effect transistor, the integrated circuit die 110 may have multiple die contacts, each for connection to a respective terminal (source, gate, drain, and if applicable, body) of the field-effect transistor. Likewise, the routing layer may provide electrical connection between the respective die contacts (for source, gate, drain, and if applicable, body) to respective package contacts. Thus, appropriate voltages may be applied to the field-effect transistor via the respective package contacts.

The routing layer 120 is relatively thin in the z-direction, extends parallel to the x-y plane, and is in contact with the integrated circuit die 110. More specifically, the routing layer 120 lies along the planar surface 111 of the integrated circuit die 110, and electrically connects the die contact 112 of the integrated circuit die 110 to the package contact 130. As an example, the routing layer 120 may be epitaxially grown on the planar surface 111 of the integrated circuit die 110. As an alternative example, the routing layer 120 may be an insert that is placed on the planar surface 111 of the integrated circuit die 110, between the integrated circuit die 110 and the package contact 130. The package contact 130 is also relatively thin in the z-direction, and extends parallel to the x-y plane, but is in contact with the routing layer 120. Because the routing layer 120 and the package contact 130 are thin in the z-direction, and because the components are stacked together in the z-direction, the circuit structure 100 is likewise relatively thin and compact.

The circuit structure 100 uses the routing layer 120 to connect the die contact 112 of the integrated circuit die 110 to the package contact 130. This is despite the layout in the x-y plane of the die contact 112 being different than the layout in the x-y plane of the package contact 130. In other words, the package contact 130 does not take the same shape as or substantially overlap the die contact 112. The routing layer 120 enables the electrical connection of the die contact 112 with the package contact 130 despite their differing layouts. Thus, the layout of the die contact 112 may be independent of the layout of the package contact 130. This allows the layout of the package contact to be specially designed to make contact with an appropriate lead or leads of a lead frame, as will later be described.

Thus, the routing layer 120 facilitates electrical connection between the die contact 112 and the package contact 130 even where they do not overlap, or overlap very little in the x-y plane. For example, in one embodiment, the package contact 130 and the die contact 112 may each overlap each other by no more than fifty percent in the x-y plane. In another embodiment, the package contact 130 and the die contact 112 may each overlap each other by no more than twenty percent in the x-y plane. In yet another embodiment, the package contact 130 and the die contact 112 do not overlap each other at all in the x-y plane.

For context, a package that includes the circuit structure 100 may use external leads to allow external devices to interact with the integrated circuit die 110 within the circuit structure 100. The leads may be attached to the package contact 130 of the circuit structure 100, such that a portion of the leads protrudes out from the package. Thus, an external device may communicate with the integrated circuit die 110 via an electrical path that includes the leads, the package contact 130, routing layer 120, and the die contact 112 of the integrated circuit die 110.

Thus, there is flexibility between how the package contacts of a package are laid out, and how the die contacts of the integrated circuit die are laid out. Accordingly, the die contacts of the integrated circuit die may be laid out however is best to accomplish the function of the integrated circuit die, regardless of how the package contacts of the package are laid out. As a corollary, packages having the same package contact layout may be used to package various types of integrated circuit dies having different die contact layouts. With such package contact layouts being laid out to accommodate leads of a lead frame, this means that a same lead frame type may be used to accommodate a variety of different packages that have different integrated circuit die.

The circuit structure 100 of FIG. 1 shows one example embodiment in which the routing layer 120 may be customized to perform the correct routing between the die contact 112 of the integrated circuit die 110 and the package contact 130 of the circuit structure 100. However, the principles described herein are not limited to the layout of the die contact 112 of the integrated circuit die 110, the customization of the routing layer 120, and the layout of the package contact 130 as illustrated in FIG. 1.

The routing layer 120 includes a conductive portion 121. An insulating layer 123 covers the bottom of the conductive portion 121. However, one or more conductive vias 122 extend from the conductive portion 121 through the insulating layer 123 to the die contact 112 of the integrated circuit die 110. The conductive portion 121 of the routing layer 120 is electrically connected to the package contact 130. Accordingly, the die contact 112 of the integrated circuit die 110 is electrically connected to the package contact 130 via an electrical path provided by the routing layer 120. Specifically, this electrical path includes the conductive vias 122 and the conductive portion 121 of the routing layer 120.

As shown in FIG. 1, the routing layer 120 includes two major portions including a first portion 124A and a second portion 124B. The first portion 124A is for making secure electrical contact with the package contact 130. Accordingly, the first portion 124A is of the same shape (in the x-y plane) as the package contact 130. This will maximize the cross-section over which current may flow between the package contact 130 and the first portion 124A of the routing layer 120, thereby reducing parasitic inductance. However, such benefit may also be achieved even if the first portion 124A was not exactly the same shape as the package contact 130.

On the other hand, the second portion 124B is for making secure electrical contact with the die contact 112. Accordingly, the second portion 124B is of the same shape (in the x-y plane) as the die contact 112. This will maximize the cross-section over which the conductive vias 122 may be placed between the die contact 112 and the second portion 124B of the routing layer, thereby also reducing parasitic inductance. However, such benefit may also be achieved even if the second portion 124B was not exactly the same shape as the die contact 112.

In this way, the routing layer 120 is capable of being customized to electrically connect the die contact 112 of the integrated circuit die 110 with the package contact 130, regardless of the layout of the die contact 112 of the integrated circuit die 110. Further, as previously described, because the die contact 112 of the integrated circuit die 110 and the package contact 130 are in close proximity to each other, connected by the conductive portion 121 and conductive vias 122 of the relatively thin routing layer 120, the overall package that contains the circuit structure 100 may be more compact, and may operate with high power density, low on-resistance, and low parasitic induction.

While FIG. 1 shows that the integrated circuit die 110 includes only one die contact 112, and that the circuit structure 100 only includes one package contact 130, as previously mentioned, the principles described herein are not limited to the number of die contacts 112 that the integrated circuit die 110 has, and are not limited to the number of package contacts 130 that the circuit structure 100 has. For example, FIG. 2 illustrates an example embodiment in which a circuit structure 200 includes multiple package contacts, and in which an integrated circuit die has multiple die contacts.

Figure 2:
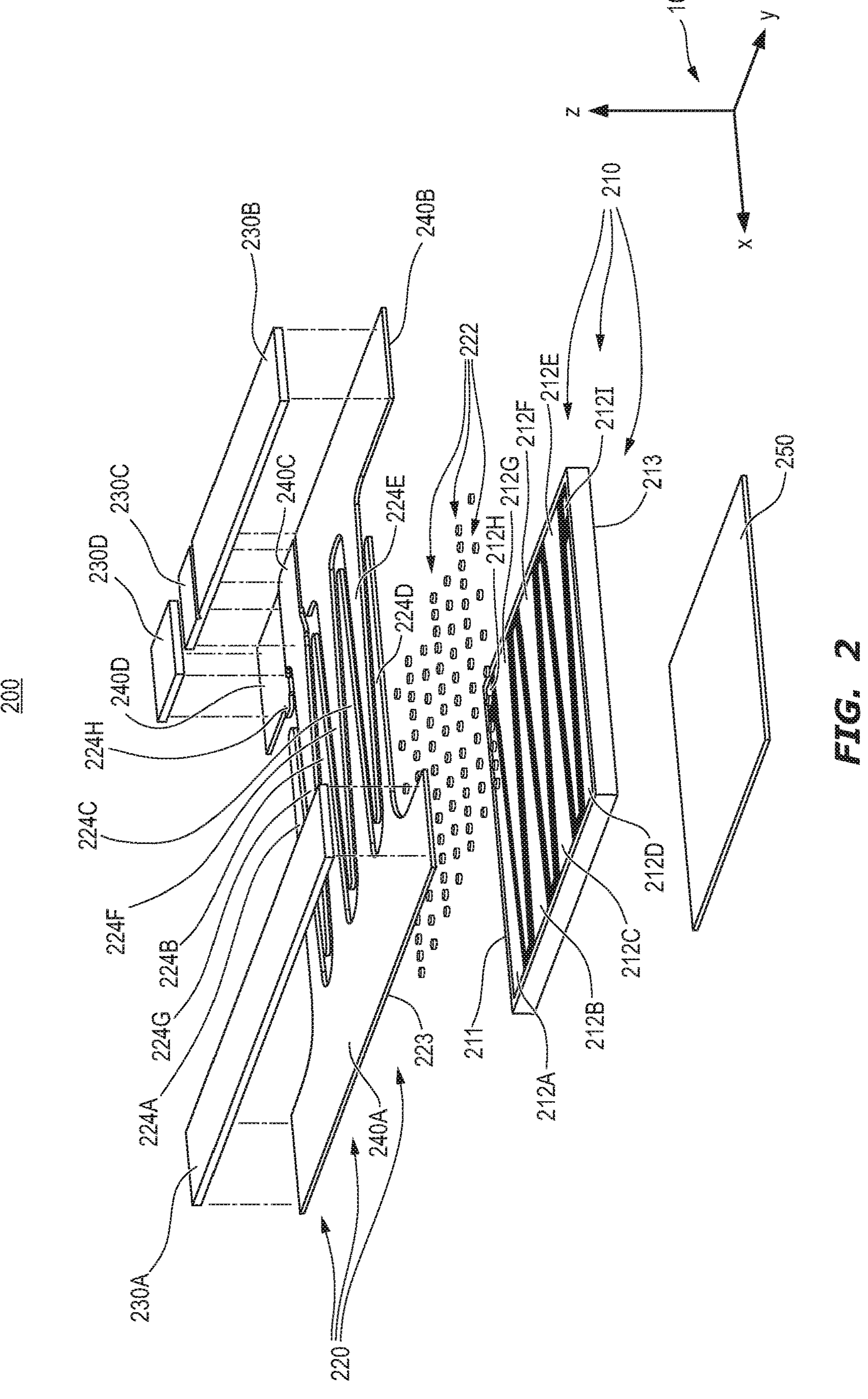
FIG. 2 illustrates a telescopic view of another circuit structure that may be contained within a package in accordance with the principles described herein.

Specifically, FIG. 2 illustrates a telescopic view of a circuit structure 200, which is another example of a circuit structure that may be contained within a package in accordance with the principles described herein. FIG. 2 likewise also illustrates the coordinate system 101. The circuit structure 200 includes an integrated circuit die 210, a routing layer 220 and multiple package contacts 230A through 230D (referred to collectively as the package contacts 230) stacked on top of each other in the positive z-direction. That is, the routing layer 220 is stacked on top of the integrated circuit die 210, and the package contacts 230 are stacked on top of the routing layer 220.

Similar to the integrated circuit die 110 of FIG. 1, the integrated circuit die 210 includes a planar surface 211 (e.g., a top surface) that extends parallel to the x-y plane. Unlike the integrated circuit die 110 of FIG. 1 that includes only one die contact 112, the integrated circuit die 210 includes multiple die contacts 212A through 212I (referred to collectively as the die contacts 212) that extend parallel to the planar surface 211 of the integrated circuit die 210. These die contacts 212 are exposed at the planar surface 211 so that the routing layer 220 can make contact with the die contacts 212. As an example, the die contacts 212 may have top surfaces that are co-planar with the planar surface 211 of the integrated circuit die 210. As an alternative example, the die contacts 212 may be layered on top of the planar surface 211 of the integrated circuit die 210. As an example, the integrated circuit die 210 may be primarily silicon as a mechanical foundation upon which to epitaxially grow other layers.

Further, the integrated circuit die 210 includes a second planar surface 213 (e.g., a bottom surface) on the opposite side of the integrated circuit die 210 as the first planar surface 211. The second planar surface 213 also extends parallel to the x-y plane. The circuit structure 200 includes a thermal layer 250 that is connected to this second planar surface 213 of the integrated circuit die 210. As an example, the thermal layer 250 may be epitaxially grown on the second planar surface 213 of the integrated circuit die 210. As an example, if the integrated circuit die 210 is composed of silicon, the bottom surface 213 may be a silicon surface on which the thermal layer 250 is epitaxially grown. The thermal layer 250 may cover a substantial portion (e.g., more than 70%) of the second planar surface 213 of the integrated circuit die 210.

When the circuit structure 200 is packaged by being encased in an encapsulating component (not shown in FIG. 2), a portion of the thermal layer 250 may remain exposed from outside of the encapsulating component and connected to a heatsink. Accordingly, heat may be transferred from the integrated circuit die 210 to the heatsink via this thermal layer 250. Thus, while a package that contains the circuit structure 200 of FIG. 2 is being used, the integrated circuit die 210 may be kept within particular temperature operating limits, thus allowing for increased operating efficiency and decreased power losses.

Returning to the die contacts 212, the die contacts 212 may, for example, make electrical contact with an integrated circuit contained within the integrated circuit die 210. As a specific example, suppose that the integrated circuit die 210 contains a power transistor and a sense transistor, each of which being field-effect transistors. Further, suppose that the gate terminals of the power transistor and the sense transistor were connected together, that the drain terminals of the power transistor and the sense transistor were connected together, and that the source terminals of the power transistor and sense transistor were instead not connected together.

In this case, the die contacts 212A through 212D may be drain contacts that electrically connect to the connected drain terminals of the power transistor and the sense transistor. Further, the die contacts 212E and 212F may be source contacts that electrically connect to the source terminal of the power transistor. Also, the die contact 212G may be a source contact that electrically connects to the source terminal of the sense transistor. Finally, the die contacts 212H and 212I may be gate contacts that electrically connect to the connected gate terminals of the power transistor and the sense transistor. Thus, appropriate voltages may be applied to the power transistor and the sense transistor via these die contacts 212.

Similar to the routing layer 120 of FIG. 1, the routing layer 220 of FIG. 2 is relatively thin in the z-direction, extends parallel to the x-y plane, and is in contact with the integrated circuit die 210. More specifically, the routing layer 220 lies along the planar surface 211 of the integrated circuit die 210, and electrically connects the die contacts 212 of the integrated circuit die 210 to the package contacts 230. Similar to the routing layer 120 of FIG. 1, the routing layer 220 may be, for example, epitaxially grown on the planar surface 211 of the integrated circuit die 210. Alternatively, the routing layer 220 may be an insert that is placed on the planar surface 211 of the integrated circuit die 210. The package contacts 230 are also relatively thin in the z-direction, extend together in the same plane parallel to the x-y plane, and lie on top of the routing layer 220 in the z-direction. Thus, similar to the circuit structure 100 of FIG. 1, because the routing layer 220 and the package contacts 230 are thin in the z-direction, and because the components are stacked together in the z-direction, the circuit structure 200 is likewise relatively thin and compact.

Similar to the circuit structure 100 of FIG. 1, the circuit structure 200 uses the routing layer 220 to electrically connect the die contacts 212 to the package contacts 230, despite there being little to no overlap in the x-y plane between the layout of the die contacts 212 and the layout of the package contacts 230. To accomplish this, the routing layer 220 includes portions that are used for making electrical contact with the die contacts 212, and different portions that are used for making electrical contact with the package contacts 230.

That is, the routing layer 220 includes various portions 240A through 240D (referred to collectively as "portions 240") that make electrical contact with respective package contacts 230A through 230D. Specifically, as represented by the dashed vertical lines, portion 240A makes electrical contact with the package contact 230A, portion 240B makes electrical contact with the package contact 230B, portion 240C makes electrical contact with the package contact 230C, and portion 240D makes electrical contact with the package contact 230D. Accordingly, the portions 240A, 240B, 240C and 240D may be of substantially the same shape as the respective package contacts 230A, 230B, 230C and 230D. This will maximize the cross-section over which current may flow between the package contacts 230 and the routing layer portions 240, thereby reducing parasitic inductance.

On the other hand, the routing layer 220 includes various portions 224A through 224H (referred to collectively as "portions 224") that make electrical contact with the die contacts 212 via conductive vias 222. Particularly, the routing layer 220 includes an insulating layer 223 that covers both the bottom of the portions 240 and the bottom of the portions 224. Further, conductive vias 222 extend from the conductive portions 224 through the insulating layer 223 to the die contacts 212. In this way, the die contacts 212 of the integrated circuit die 210 are electrically connected to the portions 224 of the routing layer 220 via these conductive vias 222.

Accordingly, the portions 224A through 224D make electrical contact with respective die contacts 212A through 212D to thereby electrically connect the routing layer 220 to the drain terminals of the power transistor and the sense transistor. Furthermore, the portions 224E and 224F make electrical contact with respective die contact 212E and 212F to thereby electrically connect the routing layer 220 to the source terminal of the power transistor. Continuing, the portion 224G makes electrical contact with the die contact 212G to thereby electrically connect the routing layer 220 to the source terminal of the sense transistor. Lastly, the portion 224H makes electrical contact with the die contact 212H to thereby electrically connect the routing layer 220 to the gate terminals of the power transistor and the sense transistor. For purposes of completeness, the die contacts 212H and 212I may be electrically connected internal to the integrated circuit die 210. Thus, portions 224 may be substantially the same shape as their respective die contact 212, maximizing the cross-sectional area over which conductive vias 222 may be placed between the die contacts 212 and the corresponding portions 224 of the routing layer 220, thereby also reducing parasitic inductance.

As an example, recall the aforementioned case of the integrated circuit die 210 including a power transistor and a sense transistor having their drain terminals connected, their gate terminals connected, but not having their source terminals connected. In this case, the package contact 230A may be a drain package contact that is connected to the connected drain terminals of the power transistor and the sense transistor via a first electrical path. Specifically, the first electrical path includes package contact 230A, conductive portion 240A, portions 224A through 224D, some of the conductive vias 222, and the die contacts 212A through 212D.

Further, the package contact 230B may be a power transistor source package contact that is connected to the source terminal of only the power transistor via a second electrical path. Specifically, that second electrical path includes the package contact 230B, the conductive portion 240B, portions 224E and 224F, some of the conductive vias 222, and the die contacts 212E and 212F.

Also, the package contact 230C may be a sense transistor source package contact that is connected to the source terminal of only the sense transistor via a third electrical path. Specifically, that third electrical path includes the package contact 230C, the conductive portion 240C, portion 224G, some of the conductive vias 222, and the die contact 212G.

Finally, the package contact 230D may be a gate package contact that is connected to the connected gate terminals of the power transistor and the sense transistor via a fourth electrical path. Specifically, that fourth electrical path includes the package contact 230D, the conductive portion 240D, portion 224H, some of the conductive vias 222, and the die contact 212H.

Accordingly, the routing layer 220 is customized to electrically connect the die contacts 212A through 212I of the integrated circuit die 210 to their corresponding package contacts 230A through 230D, while allowing the package contacts to have an appropriate layout for subsequent connection to leads of a lead frame. Thus, in the case of the die contacts 212 being connected to terminals of field-effect transistors contained within the integrated circuit die 210, appropriate voltages may be applied to the gate terminals, drain terminals, and source terminals of those field-effect transistors via electrical paths that include the package contacts 230, the conductive portions 240 and 224 of the routing layer 220, the conductive vias 222 of the routing layer 220, and the die contacts 212. Further, because the die contacts 212 and the package contacts 230 are in close proximity to each other, connected by the conductive portions 240 and 224 and the conductive vias 222 of the relatively thin routing layer 220, the overall package that contains the circuit structure 200 may be more compact, and may operate with high power density, low on-resistance, and low parasitic induction.

Figure 3:
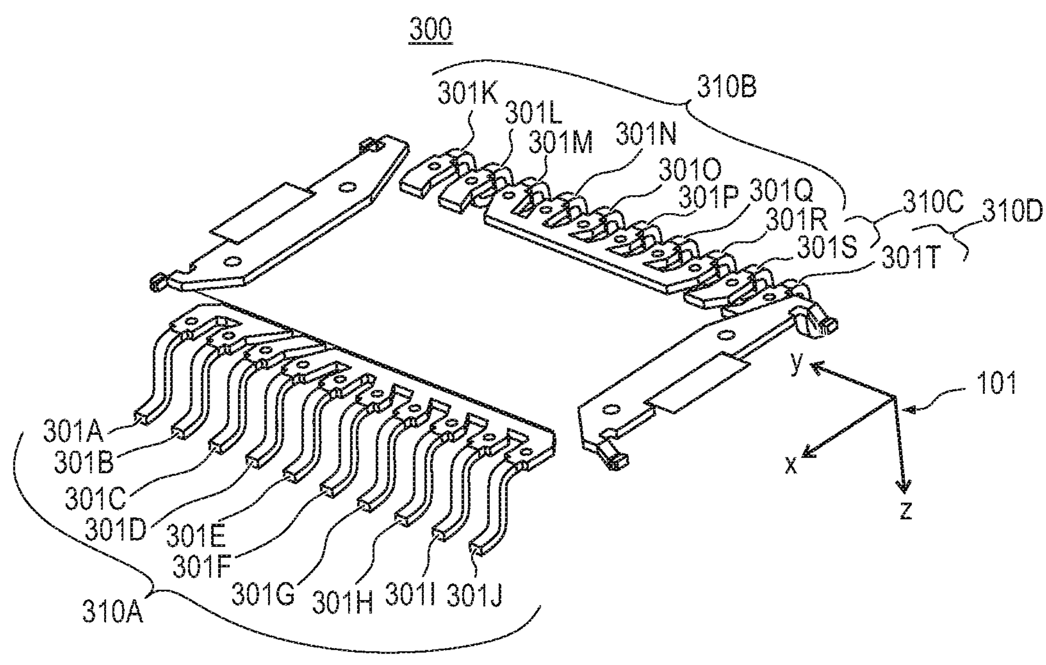
FIG. 3 illustrates an example of a portion of a lead frame that includes twenty leads to which the circuit structure of FIG. 2 may be mounted.

As previously expressed, the circuit structure 200 may be incorporated into a package that includes leads that enable interaction between external devices and the integrated circuit die 210 within the package. FIG. 3 illustrates an example of a portion 300 of a lead frame that includes twenty leads 301A through 301T (referred to collectively as "leads 301). The circuit structure 200 is mounted to the leads 301 by turning the circuit structure 200 over. Thus, FIG. 3 also illustrates the coordinate system 101, but with the positive z-direction now facing downwards, and with the positive y-direction now going the opposite direction as in FIG. 2.

Ten of the leads 301A through 301J (collectively labelled 310A) are drain leads that will be made to be in conductive contact with the drain package contact 230A of the leads 310A and will make contact with the source package contact 230A of the circuit structure 200. Eight of the leads 301K through 301R (collectively labelled 310B) are power transistor source leads that will be made to be in conductive contact with the power transistor source package contact 230B of the circuit structure 200. One of the leads 301S (also labelled 310C) is a sense transistor source lead that will be made to be in conductive contact with the sense transistor source package contact 230C of the circuit structure. The final lead 301T (also labelled 310D) is a gate lead that will be made to be in conductive contact with the gate package contact 230D of the circuit structure 200.

Figure 4:
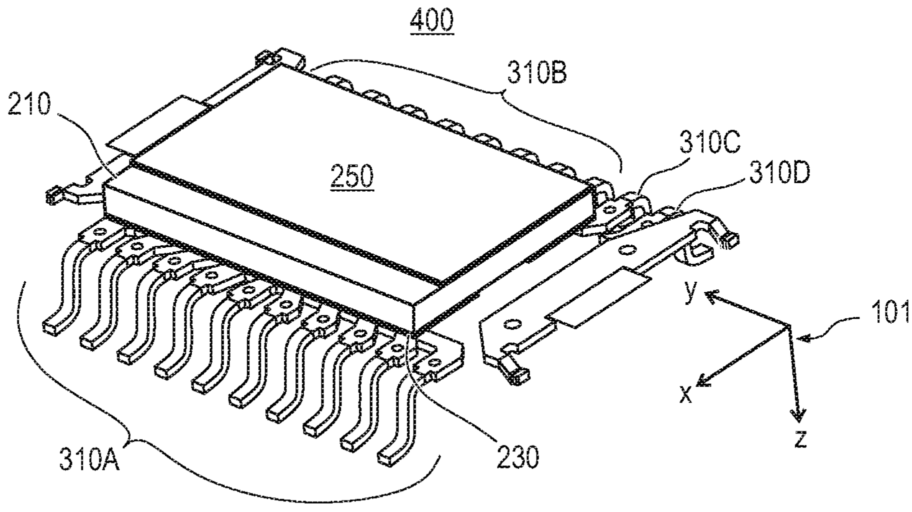
FIG. 4 illustrates a package that represents the circuit structure of FIG. 2 after mounting to the lead frame of FIG. 3.

FIG. 4 shows a package 400 that includes the circuit structure 200 of FIG. 2 turned upside down and mounted onto the leads 301. Note now that the thermal layer is facing upwards in the negative z-direction in FIG. 4. Although not visible in FIG. 1, the package contact 230A of the circuit structure 200 makes contact with the leads 310A, the package contact 230B of the circuit structure 200 makes contact with the leads 310B, the package contact 230C of the circuit structure 200 makes contact with the lead 310C, and the package contact 230D of the circuit structure 200 makes contact with the lead 310D.

Figure 5:
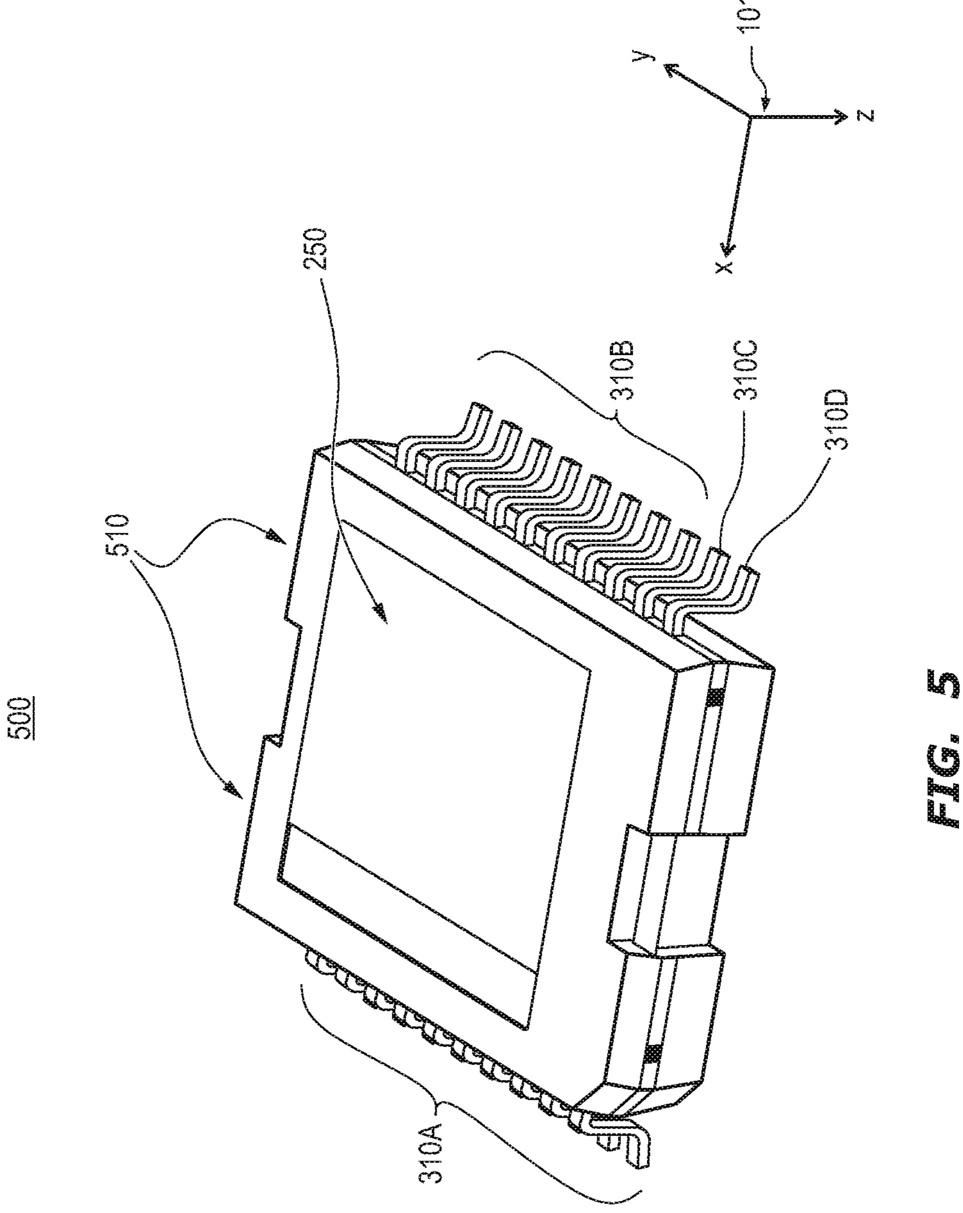
FIG. 5 illustrates a package that may include the circuit structure of FIG. 2, in which leads and a portion of a thermal layer protrude or are exposed from outside of the package.

Specifically, FIG. 5 illustrates a package 500 that represents a subsequent stage of manufacture of the package 400 of FIG. 4. Here, a protective mechanical encapsulation 510 is caused to surround the package 400 of FIG. 4, except with a window 510 that exposes the thermal layer 250, and except for the leads 301 extending outside of the mechanical encapsulation 501. As an example, the mechanical encapsulation may be injection molded plastic, or perhaps a combination of preformed pieces that latch together.

Recall the example of FIG. 2 in which the package contact 230A is a drain package contact that is connected to the connected drain terminals of the power transistor and the sense transistor contained within the integrated circuit die 210. In this case, the leads 310A may be drain leads that are attached to the drain package contact 230A of the circuit structure 200. Accordingly, an external device may apply a drain voltage to the connected drain terminals of the power transistor and the sense transistor via the leads 310A.

Further, recall the example in which the package contact 230B is a power transistor source package contact that is connected to the source terminal of only the power transistor. In this case, the leads 310B may be power transistor source leads that are attached to the power transistor source package contact 230B of the circuit structure 200. Accordingly, an external device may apply a power transistor source voltage to the source terminal of the power transistor via the leads 310B.

Also, recall the example in which the package contact 230C is a sense transistor source package contact that is connected to the source terminal of only the sense transistor. In this case, the lead 310C may be a sense transistor source lead that is attached to the sense transistor source package contact 230C of the circuit structure 200. Accordingly, an external device may apply a sense transistor source voltage to the source terminal of the sense transistor via the lead 310C.

Finally, recall the example in which the package contact 230D is a gate package contact that is connected to the connected gate terminals of the power transistor and the sense transistor. In this case, the lead 310D may be a gate lead that is attached to the gate package contact 230D of the circuit structure 200. Accordingly, an external device may apply a gate voltage to the connected gate terminals of the power transistor and the sense transistor via the lead 310D.

As previously expressed, a portion of the thermal layer 250 of the circuit structure 200 may remain exposed from the outside of the encapsulating component 320 of the package 500. Accordingly, this portion of the thermal layer 250 that remains exposed may be connected to a heatsink. Thus, when the package 500 is being used, heat generated by the integrated circuit die 210 may be transferred to the heat sink via this thermal layer 250. Accordingly, the package 500 allows the integrated circuit die 210 to be kept within particular temperature operating limits, thus allowing for increased operating efficiency and decreased power losses.

While the package 500 of FIG. 5 has been described has containing specifically the circuit structure 200 of FIG. 2, the principles described herein are not limited to the package 500 containing any particular circuit structure. In fact, the package 500 may instead contain a different circuit structure that includes multiple integrated circuit dies, as is the case in FIG. 6.

Figure 6:
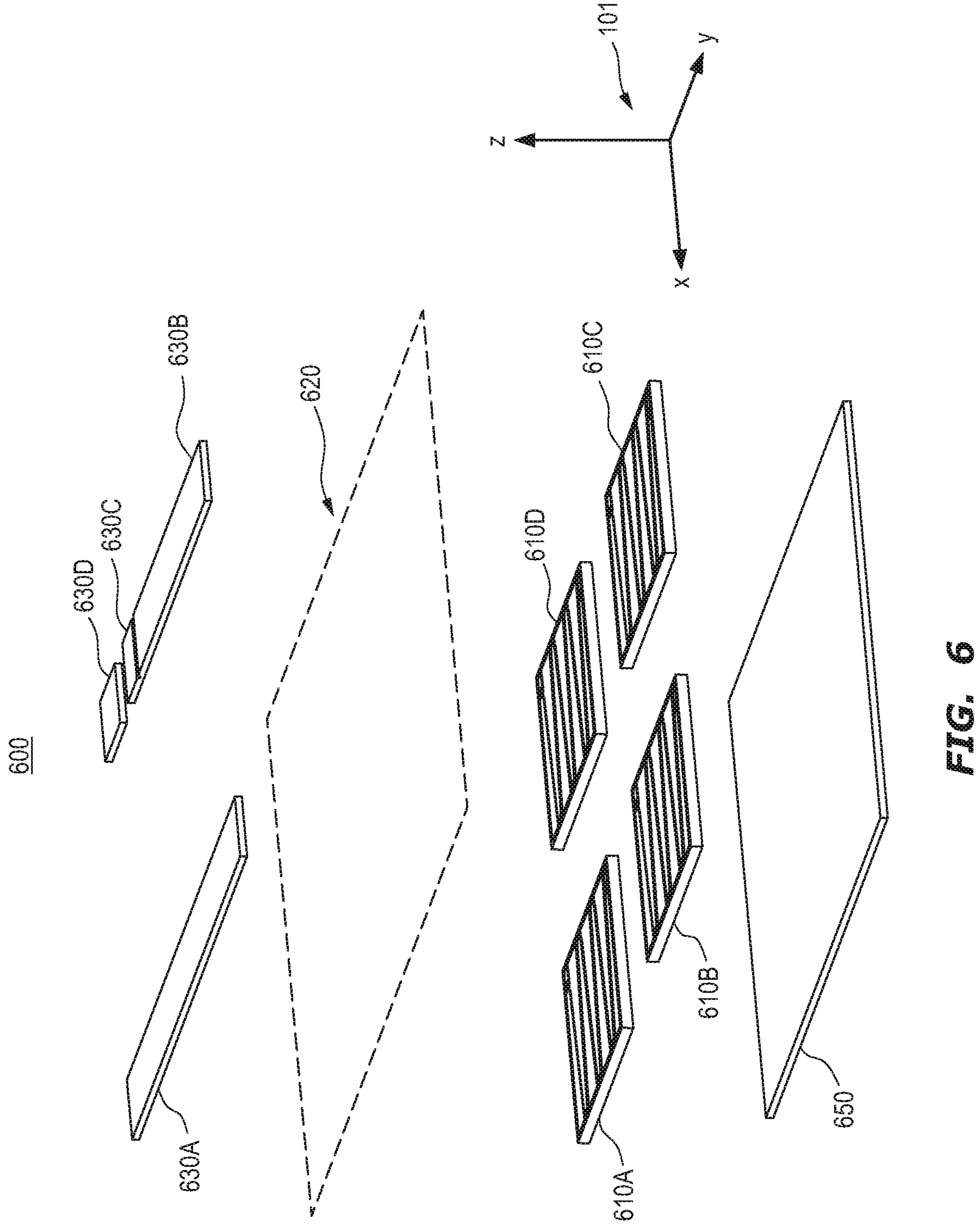
FIG. 6 illustrates a telescopic view of another circuit structure that may be contained within a package, and that includes multiple integrated circuit dies.

Specifically, FIG. 6 illustrates a circuit structure 600, which is another example of a circuit structure that may be contained within a package in accordance with the principles described herein. FIG. 6 likewise also illustrates the coordinate system 101 used in FIG. 1 and FIG. 2. The circuit structure 600 includes multiple integrated circuit dies 610A through 610D (referred to collectively as "integrated circuit dies" 610), a routing layer 620, multiple package contacts 630A through 630D (referred to collectively as "package contacts 630"), and a thermal layer 650.

In one embodiment, each of the integrated circuit dies 610 of FIG. 6 is an instance of the integrated circuit die 210 of FIG. 2. In this case, each integrated circuit die 610 may include various die contacts that could be, for example, drain contacts, source contacts, and gate contacts, as described with respect to FIG. 2. Each of the integrated circuit dies 610 may have top planar surfaces that are substantially co-planar with each other, and each of the die contacts of the integrated circuit dies 610 may also be substantially co-planar with each other. As an example, each of the integrated circuit dies 610 may be copies of each other. While each of the integrated circuit die 610 may be instances of the integrated circuit die 210 of FIG. 2, in some embodiments, one or more of the integrated circuit die 610 may contain different circuitry.

Likewise, the package contacts 630A through 630D are respective examples of the package contacts 230A through 230D of FIG. 2. Thus, as an example, the package contacts 630A, 630B, 630C, and 630D may respectively be a drain package contact 630A, a power transistor source package contact 630B, a sense transistor source package contact 630C, and a gate package contact 630D, as described with respect to FIG. 2.

Similarly, the thermal layer 650 is an example of the thermal layer 250 of FIG. 2, but may be larger in the planar direction parallel to the x-y plane so as to cover a larger surface area of the bottom planar surfaces of the integrated circuit dies 610. Alternatively, the thermal layer 650 could be approximately the same size as the thermal layer 250 of FIG. 2, but each of the integrated circuit dies 610 may instead be miniaturized versions of the integrated circuit die 210 of FIG. 2.

For purposes of explanation and simplicity, the routing layer 620 is illustrated as a dashed line box. However, in reality, the routing layer 620 may include various portions that make electrical contact with the package contacts 630, and which may be of substantially the same shape as the package contacts 630. Similarly, the routing layer 620 may include various portions that make electrical contact with the die contacts of the integrated circuit dies 610 (via conductive vias), and which may be of substantially the same shape as the die contacts.

Thus, the routing layer 620 may electrically connect each of the drain die contacts of the integrated circuit dies 610 to the drain package contact 630A. Further, the routing layer 620 may electrically connect each of the power transistor source die contacts of the integrated circuit dies 610 to the power transistor source package contact 630B. Also, the routing layer 620 may electrically connect each of the sense transistor source die contacts of the integrated circuit dies 610 to the sense transistor source package contact 630C. Finally, the routing layer 620 may electrically connect each of the gate die contacts of the integrated circuit dies 610 to the gate package contact 630D. Accordingly, the routing layer 620 may even be customized with significant complexity so as to electrically connect the die contacts of multiple integrated circuit dies 610 to their corresponding package contacts 630.

Accordingly, what has been described is a package and associated manufacturing method in which package contact layouts are laid out to accommodate leads of a lead frame. With such a technology, the same lead frame type may be used to accommodate a variety of different packages that have different integrated circuit die.

Literal Support Section

Clause 1. A package comprising: an integrated circuit die having a planar surface and having a die contact that is elongated parallel to the planar surface of the integrate circuit die, the die contact making electrical contact with an integrated circuit of the integrated circuit die; a package contact that is elongated also parallel to the planar surface of the integrated circuit die; a routing layer that includes a conductive portion that extends also parallel to the planar surface of the integrated circuit die, and that electrically connects the package contact with the die contact, wherein the package contact and the die contact have a different profile along the planar surface of the integrated circuit die; and a plurality of leads of a lead frame, at least one of the plurality of leads conductive contact with the package contact.

Clause 2. The package in accordance with Clause 1, the package contact and the die contact each not overlapping with the other by more than 50 percent in a plane parallel to the planar surface of the integrated circuit die.

Clause 3. The package in accordance with Clause 1, the package contact and the die contact each not overlapping with the other by more than 20 percent in a plane parallel to the planar surface of the integrated circuit die.

Clause 4. The package in accordance with Clause 1, the planar surface being a first planar surface, the package further comprising: a thermal layer mounted to a second planar surface of the integrated circuit die, the second planar surface of the integrated circuit die being parallel to the first planar surface of the integrated circuit die but on an opposite side of the integrated circuit die.

Clause 5. The package in accordance with Clause 4, further comprising: an encapsulating component that at least partially encapsulates the integrated circuit die, the at least one lead that makes die contact with the package contact extending out of the encapsulating component.

Clause 6. The package in accordance with Clause 5, wherein the die contact is a first die contact, the package contact is a first package contact, the conductive portion is a first conductive portion, the at least one of the plurality of leads being a first lead of the lead frame, the package further comprising: a second package contact that is elongated parallel to the planar surface of the integrated circuit die; and a second lead of the lead frame, the second lead being in conductive contact with the package contact, wherein the integrated circuit die further includes a second die contact that is elongated parallel to the planar surface of the integrated circuit die, and the routing layer further includes a second conductive portion that extends parallel to the planar surface of the integrated circuit die and that electrically connects the second package contact with the second die contact, the second package contact and the second die contact having a different profile along the planar surface of the integrated circuit die.

Clause 7. The package in accordance with Clause 6, the second die contact making electrical contact with the integrated circuit of the integrated circuit die.

Clause 8. The package in accordance with Clause 1, wherein the integrated circuit comprises a gallium-nitride transistor.

Clause 9. The package in accordance with Clause 1, wherein the integrated circuit comprises a transistor, and the die contact is a gate contact that is electrically connected to a gate terminal of a transistor.

Clause 10. The package in accordance with Clause 1, wherein the integrated circuit comprises a transistor, and the die contact is a drain contact that is electrically connected to a drain terminal of a transistor.

Clause 11. The package in accordance with Clause 1, wherein the integrated circuit comprises a transistor, and the die contact is a source contact that is electrically connected to a source terminal of a transistor.

Clause 12. The package in accordance with Clause 1, wherein integrated circuit die is a first integrated circuit die, the planar surface is a first planar surface, the die contact is a first die contact, the package contact is a first package contact, and the at least one lead of the lead frame is a first lead of the lead frame, the package further comprising: a second integrated circuit die having a second planar surface that is substantially parallel to the first planar surface of the first integrated circuit die, the second integrate circuit die having a second die contact that is elongated parallel to the second planar surface of the second integrated circuit die, the second die contact making electrical contact with an integrated circuit of the second integrated circuit die; a second package contact that is elongated parallel to the second planar surface of the second integrated circuit die, a second lead of the lead frame in conductive contact with the second package contact.

Clause 13. The package according to Clause 12, the conductive portion of the routing layer is a first conductive portion, wherein the routing layer further includes a second conductive portion that extends parallel to the second planar surface of the integrated circuit die, wherein the second conductive portion of the routing layer electrically connects the second package contact with the second die contact.

Clause 14. The package according to Clause 13, wherein the first conductive portion of the routing layer electrically connects the first package contact with the second die contact.

Clause 15. The package in accordance with claim 12, wherein the second planar surface is coplanar with the first planar surface.

Clause 16. The package in accordance with Clause 15, the second package contact and the second die contact each not overlapping by the other by more than 20 percent along the second planar surface of the second integrated circuit die.

Clause 17. The package in accordance with Clause 12, the first integrated circuit die further including a third die contact that is elongated parallel to the first planar surface of the first integrate circuit die, wherein the conductive portion of the routing layer being a first conductive portion, and the routing layer further includes a second conductive portion that extends parallel to the first planar surface and that electrically connects the second package contact with the third die contact, the second package contact and the third die contact having a different profile along the planar surface of the integrated circuit die.

Clause 18. The package in accordance with Clause 1, the routing layer being epitaxial grown on the planar surface of the integrated circuit die.

Clause 19. The package in accordance with Clause 1, the routing layer being part of an insert that is between the integrated circuit die and the package contact of the package.

Although the subject matter has been described in language specific to structural features and/or methodological acts, it is to be understood that the subject matter defined in the appended claims is not necessarily limited to the described features or acts described above, or the order of the acts described above. Rather, the described features and acts are disclosed as example forms of implementing the claims.

The present disclosure may be embodied in other specific forms without departing from its essential characteristics. The described embodiments are to be considered in all respects only as illustrative and not restrictive. All changes which come within the meaning and range of equivalency of the claims are to be embraced within their scope.

When introducing elements in the appended claims, the articles “a,” “an,” “the,” and “said” are intended to mean there are one or more of the elements. The terms “comprising,” “including,” and “having” are intended to be inclusive and mean that there may be additional elements other than the listed elements.

What is claimed:

1. A package comprising:

an integrated circuit die having a planar surface and having a die contact that is elongated parallel to the planar surface of the integrated circuit die, the die contact making electrical contact with an integrated circuit of the integrated circuit die;

a package contact that is elongated also parallel to the planar surface of the integrated circuit die;

a routing layer being epitaxially grown on the planar surface of the integrated circuit die that includes a conductive portion that extends also parallel to the planar surface of the integrated circuit die, and that electrically connects the package contact with the die contact, wherein the package contact and the die contact have a different profile along the planar surface of the integrated circuit die; and a plurality of leads of a lead frame, at least one of the plurality of leads conductive contact with the package contact.

2. The package in accordance with claim 1, the package contact and the die contact each not overlapping with the other by more than 50 percent in a plane parallel to the planar surface of the integrated circuit die.

3. The package in accordance with claim 1, the package contact and the die contact each not overlapping with the other by more than 20 percent in a plane parallel to the planar surface of the integrated circuit die.

4. The package in accordance with claim 1, the planar surface being a first planar surface, the package further comprising:

a thermal layer mounted to a second planar surface of the integrated circuit die, the second planar surface of the integrated circuit die being parallel to the first planar surface of the integrated circuit die but on an opposite side of the integrated circuit die.

5. The package in accordance with claim 4, further comprising:

an encapsulating component that at least partially encapsulates the integrated circuit die, the at least one lead that makes die contact with the package contact extending out of the encapsulating component.

6. The package in accordance with claim 5, wherein the die contact is a first die contact, the package contact is a first package contact, the conductive portion is a first conductive portion, the at least one of the plurality of leads being a first lead of the lead frame, the package further comprising:

a second package contact that is elongated parallel to the planar surface of the integrated circuit die; and a second lead of the lead frame, the second lead being in conductive contact with the package contact, wherein the integrated circuit die further includes a second die contact that is elongated parallel to the planar surface of the integrated circuit die, and the routing layer further includes a second conductive portion that extends parallel to the planar surface of the integrated circuit die and that electrically connects the second package contact with the second die contact, the second package contact and the second die contact having a different profile along the planar surface of the integrated circuit die.

7. The package in accordance with claim 6, the second die contact making electrical contact with the integrated circuit of the integrated circuit die.

8. The package in accordance with claim 1, wherein the integrated circuit comprises a gallium-nitride transistor.

9. The package in accordance with claim 1, wherein the integrated circuit comprises a transistor, and the die contact is a gate contact that is electrically connected to a gate terminal of a transistor.

10. The package in accordance with claim 1, wherein the integrated circuit comprises a transistor, and the die contact is a drain contact that is electrically connected to a drain terminal of a transistor.

11. The package in accordance with claim 1, wherein the integrated circuit comprises a transistor, and the die contact is a source contact that is electrically connected to a source terminal of a transistor.

12. The package in accordance with claim 1, the routing layer being part of an insert that is between the integrated circuit die and the package contact of the package.

13. A package comprising:

a first integrated circuit die having a first planar surface and having a first die contact that is elongated parallel to the first planar surface of the first integrated circuit die, the first die contact making electrical contact with an integrated circuit of the first integrated circuit die;

a first package contact that is elongated also parallel to the first planar surface of the first integrated circuit die;

a routing layer that includes a conductive portion that extends also parallel to the first planar surface of the first integrated circuit die, and that electrically connects the first package contact with the first die contact, wherein the first package contact and the first die contact have a different profile along the first planar surface of the first integrated circuit die;

a plurality of leads of a lead frame, at least one of the plurality of leads is a first lead of the lead frame and is in conductive contact with the first package contact;

a second integrated circuit die having a second planar surface that is substantially parallel to the first planar surface of the first integrated circuit die, the second integrated circuit die having a second die contact that is elongated parallel to the second planar surface of the second integrated circuit die, the second die contact making electrical contact with an integrated circuit of the second integrated circuit die; and a second package contact that is elongated parallel to the second planar surface of the second integrated circuit die, at least one lead of the lead frame is a second lead of the lead frame and is in conductive contact with the second package contact.

14. The package according to claim 13, the conductive portion of the routing layer is a first conductive portion, wherein the routing layer further includes a second conductive portion that extends parallel to the second planar surface of the second integrated circuit die, wherein the second conductive portion of the routing layer electrically connects the second package contact with the second die contact.

15. The package according to claim 14, wherein the first conductive portion of the routing layer electrically connects the first package contact with the second die contact.

16. The package in accordance with claim 13, wherein the second planar surface is coplanar with the first planar surface.

17. The package in accordance with claim 16, the second package contact and the second die contact each not overlapping by the other by more than 20 percent along the second planar surface of the second integrated circuit die.

18. The package in accordance with claim 13, the first integrated circuit die further including a third die contact that is elongated parallel to the first planar surface of the first integrated circuit die, wherein the conductive portion of the routing layer being a first conductive portion, and the routing layer further includes a second conductive portion that extends parallel to the first planar surface and that electrically connects the second package contact with the third die contact, the second package contact and the third die contact having a different profile along the planar surface of the integrated circuit die.

* * * * *